(12) United States Patent
Kim et al.

(10) Patent No.: US 12,545,650 B2
(45) Date of Patent: Feb. 10, 2026

(54) BISANTHRACENE DERIVATIVES HAVING SOLUBILIZING SUBSTITUENT, AND ORGANIC ELECTROLUMINESCENCE DEVICE USING SAME

(71) Applicant: LG Chem, Ltd., Seoul (KR)

(72) Inventors: Yongwook Kim, Daejeon (KR); Jaechol Lee, Daejeon (KR); Hisayuki Kawamura, Tokyo (JP); Shinji Shiraki, Tokyo (JP); Tsukasa Owada, Yamagata (JP); Ayato Arai, Yamagata (JP); Hisahiro Sasabe, Yamagata (JP); Junji Kido, Yamagata (JP)

(73) Assignee: LG Chem, Ltd., Seoul (KR)

( * ) Notice: Subject to any disclaimer, the term of this patent is extended or adjusted under 35 U.S.C. 154(b) by 884 days.

(21) Appl. No.: 17/790,846

(22) PCT Filed: Jan. 8, 2021

(86) PCT No.: PCT/KR2021/000229
§ 371 (c)(1),
(2) Date: Jul. 5, 2022

(87) PCT Pub. No.: WO2021/141428
PCT Pub. Date: Jul. 15, 2021

(65) Prior Publication Data
US 2023/0089555 A1 Mar. 23, 2023

(30) Foreign Application Priority Data
Jan. 9, 2020 (JP) .................... 2020-002062

(51) Int. Cl.
*H01L 51/54* (2006.01)
*C07C 211/54* (2006.01)
*C07D 209/84* (2006.01)
*C07D 219/02* (2006.01)
*C07D 223/14* (2006.01)
*C07D 241/46* (2006.01)
*C07D 265/38* (2006.01)
*C07D 279/30* (2006.01)
*C07D 471/04* (2006.01)
*C07F 5/02* (2006.01)
*C07F 7/08* (2006.01)
*H10K 50/12* (2023.01)
*H10K 85/40* (2023.01)
*H10K 85/60* (2023.01)

(52) U.S. Cl.
CPC .......... *C07D 241/46* (2013.01); *C07C 211/54* (2013.01); *C07D 209/84* (2013.01); *C07D 219/02* (2013.01); *C07D 223/14* (2013.01); *C07D 265/38* (2013.01); *C07D 279/30* (2013.01); *C07D 471/04* (2013.01); *C07F 5/027* (2013.01); *C07F 7/0812* (2013.01); *H10K 50/12* (2023.02); *H10K 85/40* (2023.02); *H10K 85/615* (2023.02); *H10K 85/631* (2023.02); *H10K 85/657* (2023.02); *H10K 85/6572* (2023.02); *H10K 85/658* (2023.02)

(58) Field of Classification Search
None
See application file for complete search history.

(56) References Cited

U.S. PATENT DOCUMENTS

| | | | |
|---|---|---|---|
| 5,635,308 | A | 6/1997 | Inoue et al. |
| 2005/0089715 | A1* | 4/2005 | Cosimbescu ........ H10K 85/615 |
| | | | 313/506 |
| 2010/0044681 | A1 | 2/2010 | Kim et al. |

FOREIGN PATENT DOCUMENTS

| | | |
|---|---|---|
| CN | 106187963 A | 12/2016 |
| JP | 2000344691 A | 12/2000 |
| JP | 2006193528 A | 7/2006 |
| JP | 2008085363 A | 4/2008 |
| JP | 2014122212 A | 7/2014 |
| JP | 2015159238 A | 9/2015 |
| JP | 6381201 B2 | 8/2018 |
| KR | 20060056954 A | 5/2006 |
| KR | 20070104086 A | 10/2007 |
| KR | 20100108914 A | 10/2010 |
| KR | 20130059513 A | 6/2013 |
| KR | 20160132318 A | 11/2016 |
| WO | 2010114263 A2 | 10/2010 |

OTHER PUBLICATIONS

International Search Report for Application No. PCT/KR2021/000229 mailed Apr. 28, 2021, pp. 1-3.

* cited by examiner

*Primary Examiner* — Andrew K Bohaty
(74) *Attorney, Agent, or Firm* — Lerner David LLP

(57) ABSTRACT

The present invention is to provide a light emitting material, for an organic EL device, exhibiting higher light emitting efficiency, and particularly, to provide a blue light emitting material,
wherein the light emitting material comprises a compound of the following General Formula (1):

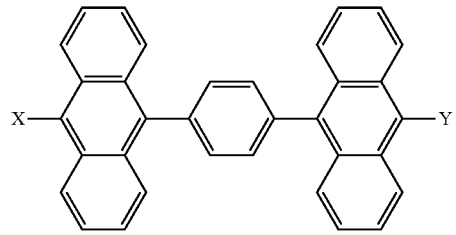

X is an aryl group including a tertiary amine structure, and Y is a phenyl group having an alkyl or aryl substituent at one ortho position.

8 Claims, 3 Drawing Sheets

[FIG. 1]
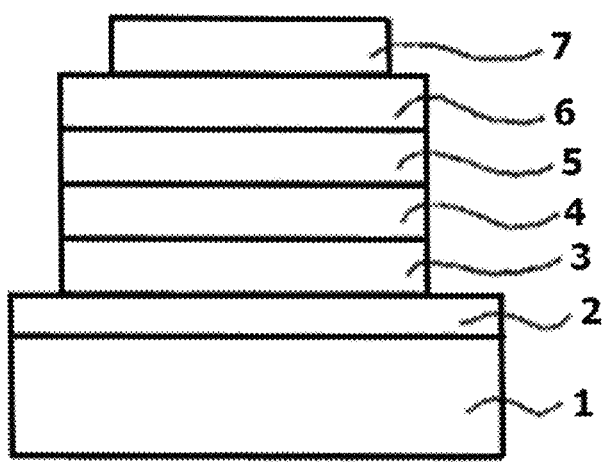

[FIG. 2]
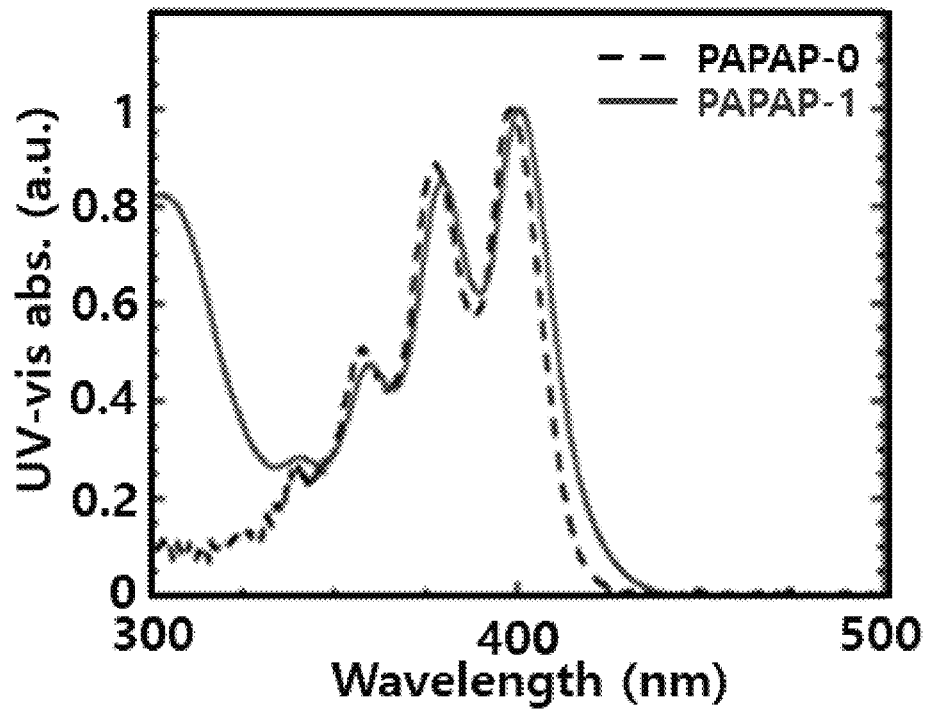
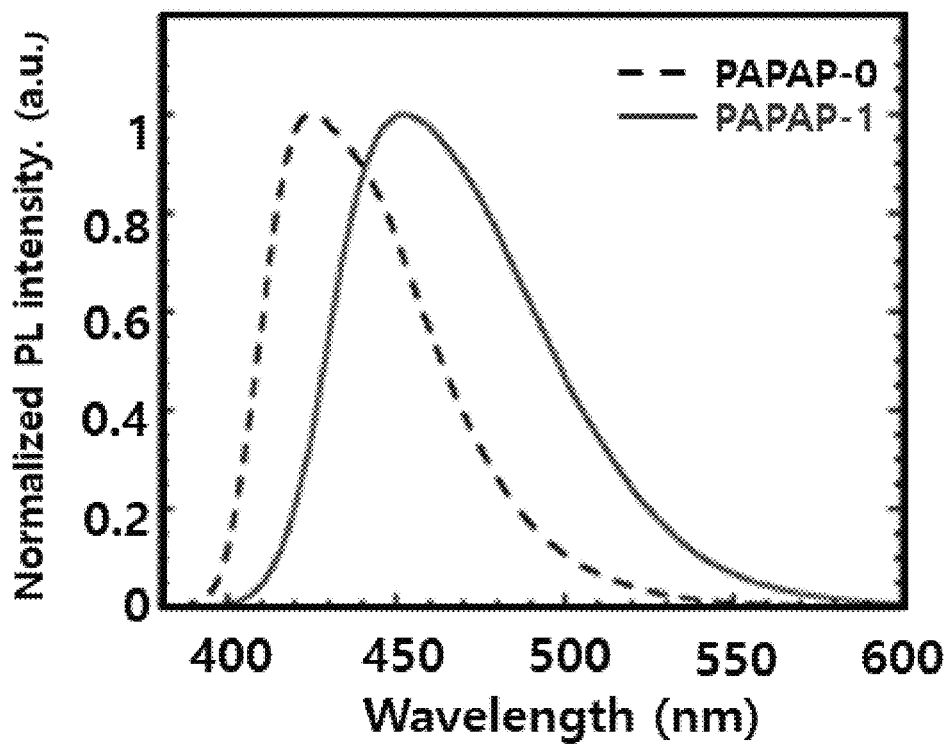

[FIG. 3]
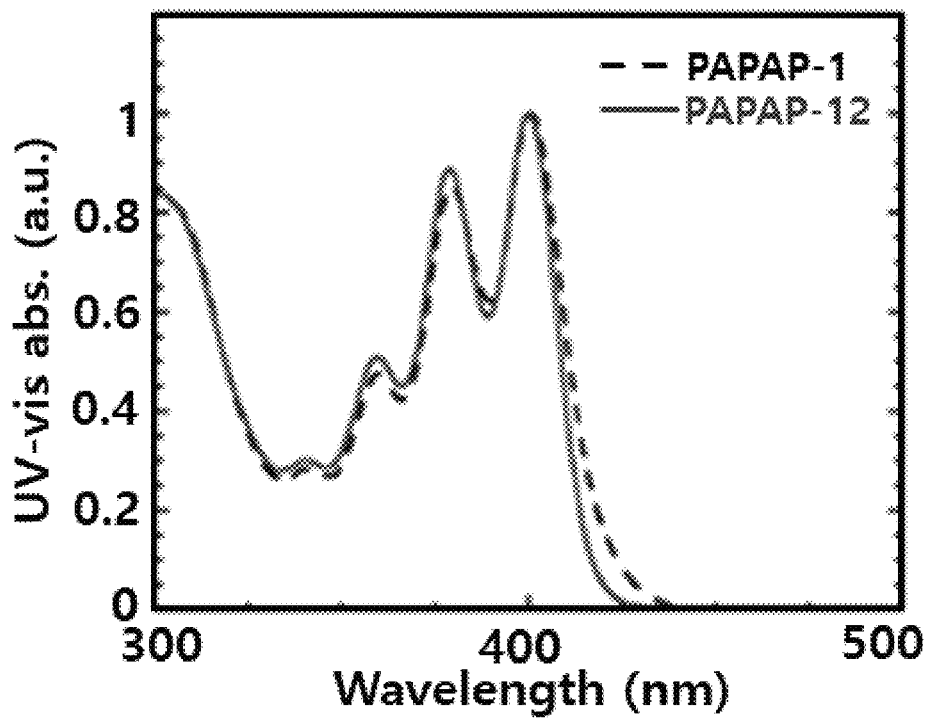
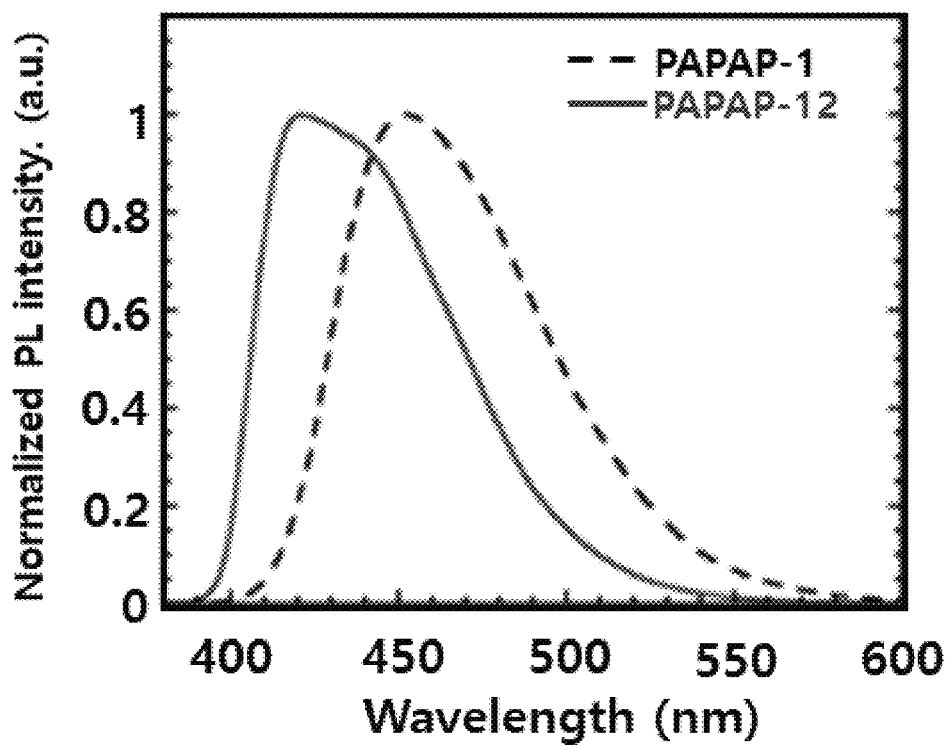

BISANTHRACENE DERIVATIVES HAVING SOLUBILIZING SUBSTITUENT, AND ORGANIC ELECTROLUMINESCENCE DEVICE USING SAME

CROSS-REFERENCE TO RELATED APPLICATION(S)

The present application is a national stage entry under 35 U.S.C. § 371 of International Application No. PCT/KR2021/000229 filed on Jan. 8, 2021, which claims priority from Japanese Patent Application No. 2020-002062 filed on Jan. 9, 2020, all the disclosures of which are incorporated herein by reference.

TECHNICAL FIELD

The present invention relates to a novel bisanthracene derivative having a solubilizing substituent, and an organic electroluminescence device including the bisanthracene derivative.

BACKGROUND ART

An organic electroluminescence device (hereinafter, also referred to as an organic EL device) typically has a structure including an anode, a cathode and an organic material layer including a light emitting layer disposed between these electrodes. In the organic EL device, light is emitted from a light emitting material molecule using the energy of an exciton generated by the recombination of holes and electrons injected from the anode and the cathode, respectively. Here, generally, an organic material layer of the organic EL device has a multi-layer structure consisting of a plurality of layers including different materials having different functions in order to enhance characteristics of the organic EL device, for example, the light emitting efficiency, and the plurality of layers are composed of, for example, a hole injection layer, a hole transport layer, a light emitting layer, an electron transport layer, an electron injection layer, and the like. However, one layer may be responsible for several functions of these layers, and accordingly, several of these layers may be omitted. Further, in addition to these organic material layers, a planarization layer for enhancing the smoothness of the surface of an electrode, and a hole blocking layer, an electron blocking layer, and/or an exciton blocking layer for confining holes, electrons, and/or excitons in a light emitting layer may be included in an organic layer of the organic EL device.

In an organic EL device having such a structure, when a voltage is applied between two electrodes, holes and electrons are injected from an anode and a cathode, respectively, into an organic material layer, and when the injected holes and electrons are combined, excitons having higher energy than the ground state energy of a luminescent molecule are formed in the luminescent molecule, and light is emitted when the excitons are returned to the ground state. Such an organic EL device is a self-luminous light emitting device, and is known to have characteristics such as high brightness, high efficiency, a low driving voltage, a wide viewing angle, high contrast, and a high speed response as compared to a liquid crystal device using a backlight in the related art.

As a light emitting function of the organic EL device, it is known to use fluorescence emission generated by the transition from the excited state to the ground state of a singlet exciton and phosphorescence emission generated by the transition from the excited triplet state to the ground state of an exciton. Further, recently, organic EL devices exhibiting a high light emitting efficiency, which use an organic compound that causes delayed fluorescence emission as a light emitting material, have also been developed.

A light emitting material used in the organic EL device may be classified into blue, green, and red light emitting materials according to the light emitting color, and yellow and orange light emitting materials required to realize a better natural color. Meanwhile, when a light emitting layer is formed with only one material, there may occur problems in that the maximum light emitting wavelength moves to a longer wavelength, and thus the color purity deteriorates due to the intermolecular interaction, or the efficiency of the device decreases due to the light emission attenuation effect, so that in order to increase the color purity of the light emission and improve the light emitting efficiency, it is possible to use a host/dopant system including a light emitting material and a host material in the light emitting layer.

Luminous compounds having various chemical structures have been developed to date with the aim of higher light emitting efficiency, higher color purity, and longer service life. As a compound capable of being used as a light emitting material for an organic EL device, the specification of U.S. Pat. No. 5,635,308 describes a method for using a bisanthracene derivative as a blue light emitting material for an organic EL device.

In addition, the gazette of Japanese Patent No. 6381201 describes a bisanthracene derivative that exhibits high-efficiency light emission by introducing a specific substituent.

RELATED ART DOCUMENTS

Patent Document

U.S. Pat. No. 5,635,308
Japanese Patent No. 6381201

DETAILED DESCRIPTION OF THE INVENTION

Technical Problem

Among the light emitting materials for an organic EL device, further improvement of characteristics such as light emitting efficiency and service life is particularly desired for a blue light emitting material. The present invention has been made in an effort to provide a light emitting material for an organic EL device, exhibiting higher light emitting efficiency, and particularly, to provide a blue light emitting material. In particular, the present invention has been made in an effort to provide a blue light emitting material suitable for an organic EL device which is excellent in productivity of the device by an application method.

Technical Solution

To solve the above problems, the present invention uses a compound of the following General Formula (1) as a light emitting material for an organic EL device, that is, an organic electroluminescence device.

Therefore, the organic EL device of the present invention includes a cathode, an anode, and an organic layer disposed between the cathode and the anode, and is characterized in that the organic layer includes a compound of the following General Formula (1).

General Formula (1)

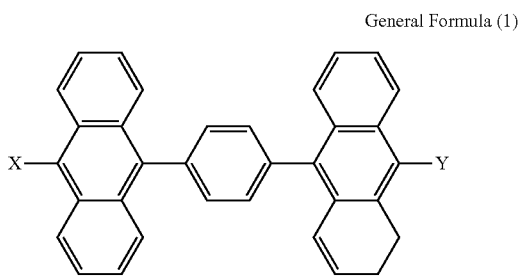

In General Formula (1), X and Y represent substituents, and X and Y do not have the same structure.

X is an aryl group including a tertiary amine structure, and Y is a phenyl group having an alkyl or aryl substituent at one ortho position.

In General Formula (1), it is preferred that X is a substituent of the following General Formula (2).

General Formula (2)

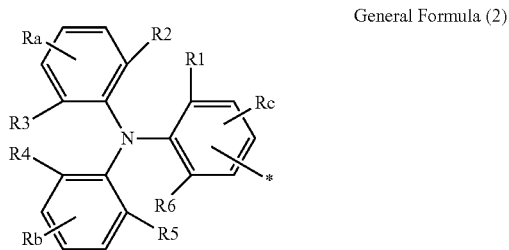

In General Formula (2), Ra and Rb, including the positions of R2 to R5, independently represent a substituent optionally mono-, di-, tri-, tetra-, or penta-substituted for a ring to which Ra and Rb are each bound, or independently are not present. Rc, including the positions of R1 and R6, exhibits a substituent optionally mono-, di-, tri-, or tetra-substituted for a ring to which Rc is bound, or is not present. Furthermore, the substituent is independently a group selected from the group consisting of an alkyl, particularly, a straight-chained, branched, or cyclic alkyl group having 1 to 10 carbon atoms, and an aryl group, particularly, an aryl group having 6 to 20 carbon atoms.

Examples of the alkyl group include methyl, ethyl, propyl, n-butyl, sec-butyl, tert-butyl, and the like, but are not limited thereto. As the alkyl group, a methyl group or a tert-butyl group is particularly preferred. Examples of the aryl group include a group such as phenyl, biphenyl, terphenyl, and naphthyl, but are not limited thereto.

R2 to R5 are each independently hydrogen, R1 and R6 are each independently hydrogen or a bonding site to the anthracene ring core on the left side of General Formula (1), or R1 and R2, R3 and R4, and R5 and R6 are each independently bonded with each other, respectively, one pair to three pairs among them, preferably one pair or two pairs, particularly preferably one pair, through a single bond, or may be bonded through an alkylene, particularly, an alkylene having 1 to 6 carbon atoms, an arylene, particularly, an arylene having 6 to 20 carbon atoms, —O—, —S—, silylene (SiR11R12) (R11 and R12 independently exhibit an alkyl, preferably a straight-chained, branched, or cyclic alkyl group having 1 to 10 carbon atoms, or an aryl group, particularly an aryl group having 6 to 20 carbon atoms, and preferably phenyl, tolyl, or naphthyl, and particularly preferably, SiR11R12 is diphenylsilylene), —NR—, or —BR— (R exhibits a hydrogen atom, an alkyl group, preferably a straight-chained, branched, or cyclic alkyl having 1 to 10 carbon atoms, or an aryl group, preferably an aryl group having 6 to 20 carbon atoms, and particularly preferably phenyl, tolyl, or a naphthyl group) to form a ring structure.

The rightmost benzene ring of General Formula (2) may be bonded to the anthracene ring on the left side of General Formula (1) at any position including the positions of R1 and R6, and * in General Formula (2) indicates a position to be bonded to the anthracene ring on the left side of General Formula (1). A bond marked with * may be at any of the ortho, meta, or para positions of the benzene ring with respect to a nitrogen atom of the triphenylamine.

In General Formula (2), when R1 and R2, R3 and R4, and R5 and R6 are each independently bonded with each other through a single bond, an alkylene (including alkylidene), an arylene, —O—, —S—, and the like or a bridging group, two carbon atoms to which each pair of R1 and R2, R3 and R4, and R5 and R6 are bonded are bonded through a single bond, an alkylene (including alkylidene), an arylene, —O—, —S—, and the like or a bridging group. In particular, in General Formula (2), it is preferred that R1 and R2, R3 and R4, or R5 and R6 are bonded with each other through a single bond, —C(CH$_3$)$_2$—, —O—, —S—, —Si(Ph)$_2$—, —N(Ph)—, —B(Ph)—, or a 1,2-phenylene group. Further, in General Formula (2), two pairs among R1 and R2, R3 and R4, and R5 and R6 are bonded with each other through a single bond. In addition, in the formula, one pair among R1 and R2, R3 and R4, and R5 and R6 may be linked with each other through a single bond, and two carbon atoms of another pair may be linked with each other through —C(CH$_3$)$_2$—, —O—, —S—, —Si(Ph)$_2$—, —N(Ph)—, —B(Ph)—, or a 1,2-phenylene group.

In General Formula (1), Y is a phenyl group having an alkyl or aryl group as a substituent at one o-position (ortho position) thereof. Examples of the substituent include a straight-chained, branched, or cyclic alkyl group having 1 to 10 carbon atoms, and an aryl group having 6 to 20 carbon atoms. Examples of the alkyl group include methyl, ethyl, propyl, n-butyl, sec-butyl, tert-butyl, and the like, but are not limited thereto. Examples of the aryl group include phenyl, 1-naphthyl, 2-naphthyl, and the like, but are not limited thereto. Further, a group in which two or more aryl groups are linked, for example, a biphenyl group, a terphenyl group, a naphthylphenyl group and the like are also included in the aryl group.

It is particularly preferred that Y is an o-biphenyl group (or a 2-biphenyl group).

Examples of the compound of General Formula (1) include the compounds of the chemical formulae shown below.

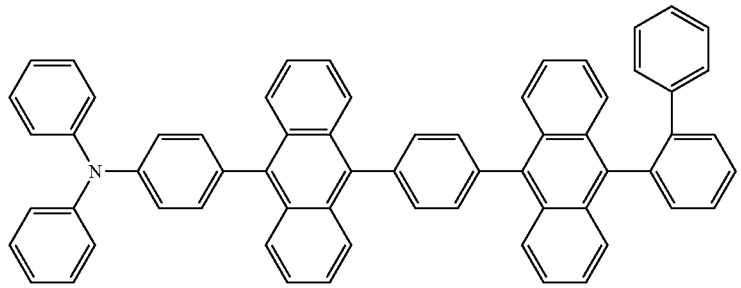
PAPAP-1
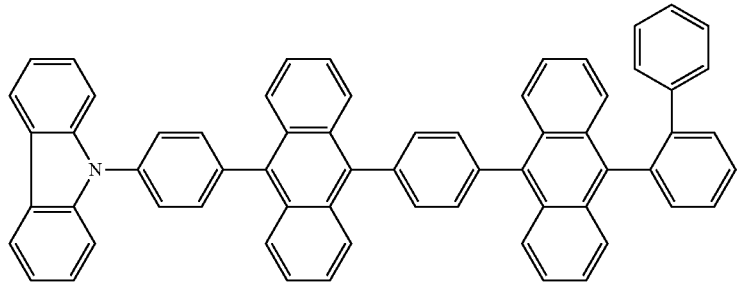
PAPAP-2
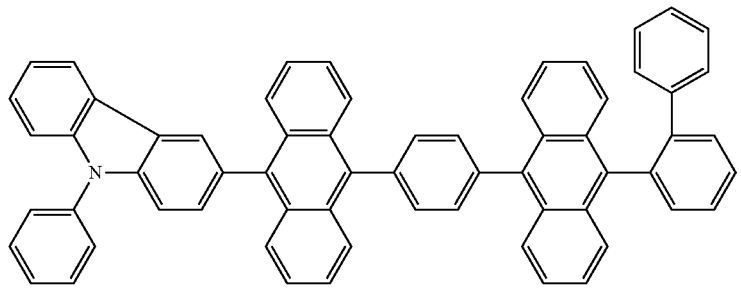
PAPAP-3
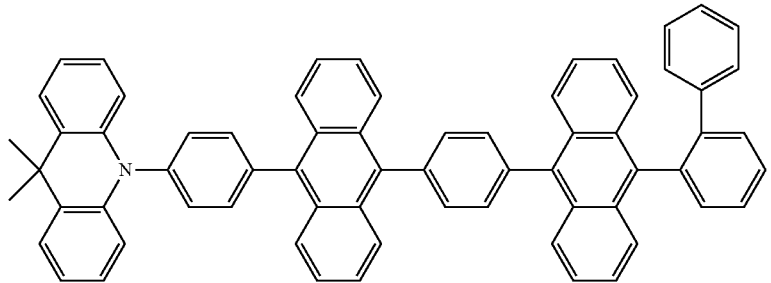
PAPAP-4
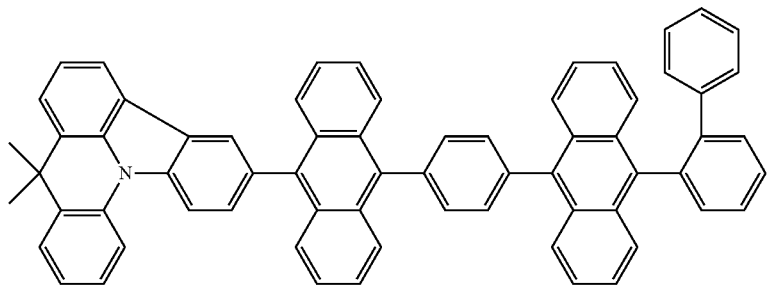
PAPAP-5

-continued
PAPAP-6
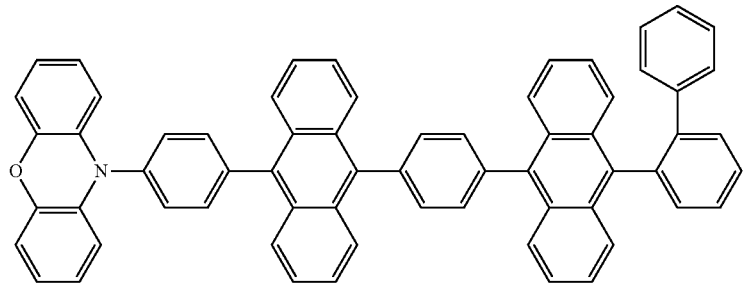
PAPAP-7
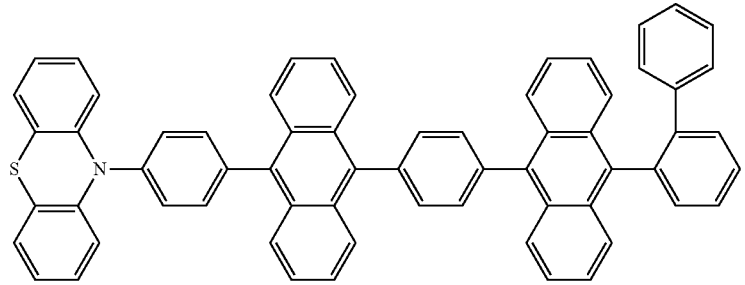
PAPAP-8
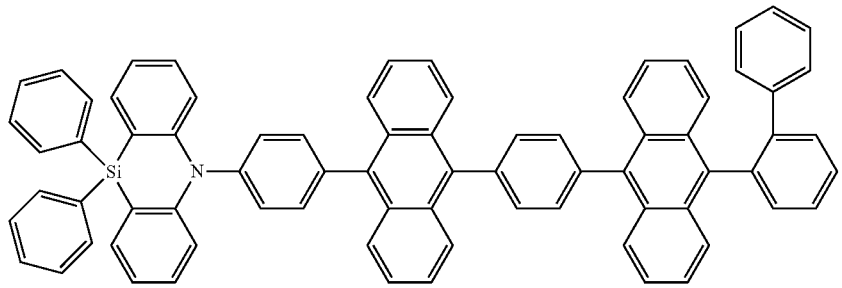
PAPAP-9
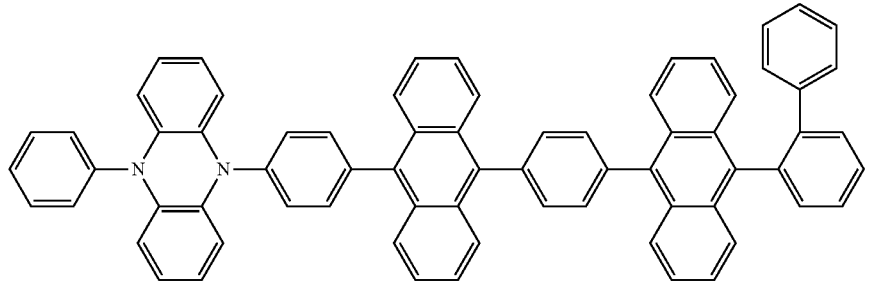
PAPAP-10
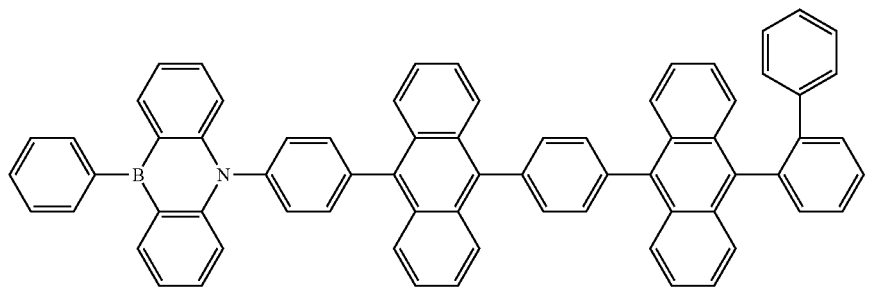

PAPAP-11
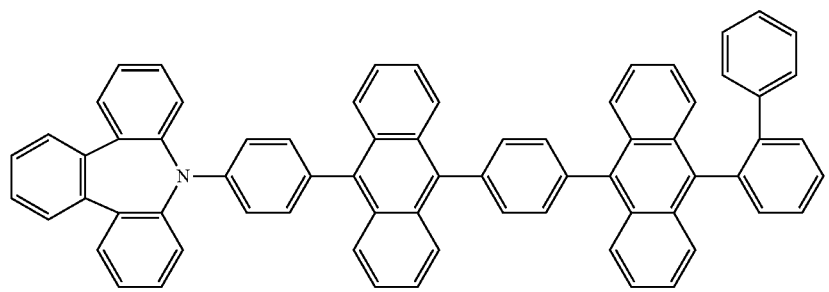
PAPAP-12
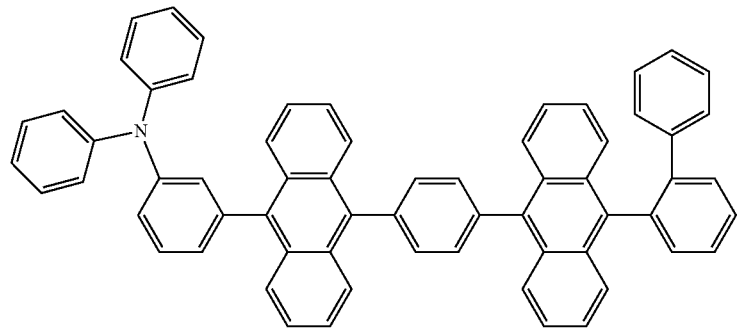
PAPAP-13
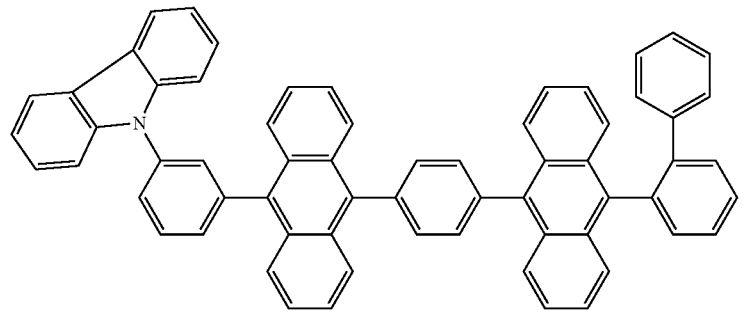
PAPAP-14
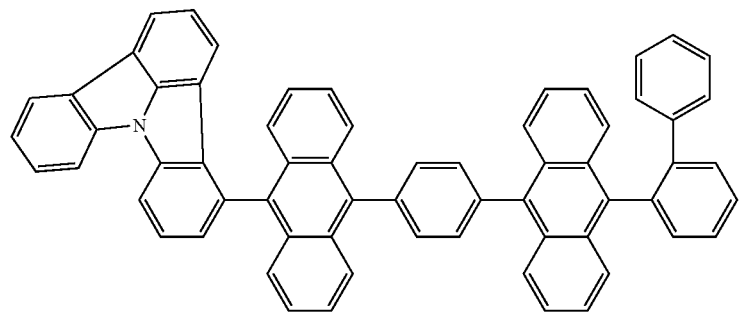
PAPAP-15
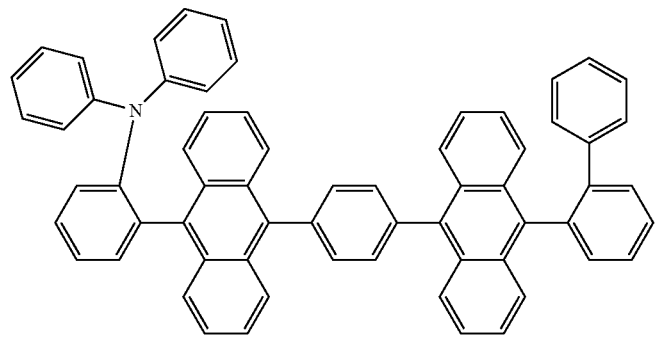

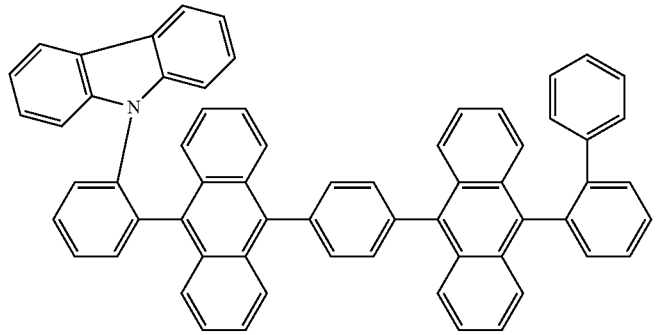

PAPAP-16

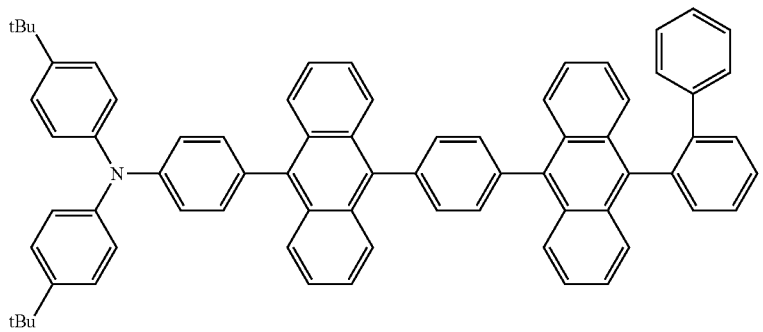

PAPAP-17

The present invention also provides a light emitting material for an organic electroluminescence device (also referred to as an organic EL device), including a compound of General Formula (1).

The present invention also relates to an organic electroluminescence device including the compound of General Formula (1), particularly, an organic EL device provided with an organic layer including a compound of General Formula (1).

In the organic EL device of the present invention, it is preferred that an organic layer containing the compound of General Formula (1) is a light emitting layer.

It is particularly preferred that the compound of General Formula (1) is included as an emitter (light emitting body) in a light emitting layer of an organic EL device.

Therefore, the compound of the present invention is useful as an emitter for an organic EL device.

It is preferred that the organic EL device of the present invention further includes a host material in the light emitting layer in addition to including the compound of General Formula (1) as an emitter in the light emitting layer. The host material is not particularly limited, but is preferably an anthracene derivative compound different from the compound used as an emitter, preferably an anthracene derivative compound which is an aromatic hydrocarbon having no amino group in the molecule. The anthracene derivative compound refers to a compound in which a substituent in an anthracene skeleton is additionally substituted. Examples of the anthracene derivative compound include 9,10-diphenylanthracene, 9,10-di(1-naphthyl)anthracene, 9,10-di(2-naphthyl)anthracene, 9,10-diphenylanthracene, 9-(naphthalen-1-yl)-10-(naphthalen-2-yl)anthracene (α,β-ADN), 2-methyl-9,10-di(2-naphthyl)anthracene, 2-methyl-9,10-di(1-naphthyl)anthracene, and 2-methyl-9-(naphthalen-1-yl)-10-(naphthalen-2-yl)anthracene, but are not limited thereto.

In the organic EL device of the present invention, it is preferred that the compound of General Formula (1) is included in the light emitting layer, particularly in an amount of 0.1 to 10 mass % based on the mass of the light emitting layer.

BRIEF DESCRIPTION OF DRAWINGS

FIG. 1 is a view schematically illustrating a typical structure of an organic EL device.

FIG. 2 is a view illustrating an absorption (UV-vis) spectrum (left) and a light emitting (PL) spectrum (right) of a toluene solution ($10^{-5}$ M) of PAPAP-1 and PAPAP-0.

FIG. 3 is a view illustrating an absorption (UV-vis) spectrum (left) and a light emitting (PL) spectrum (right) of a toluene solution ($10^{-5}$ M) of PAPAP-1 and PAPAP-12.

EXPLANATION OF REFERENCE NUMERALS AND SYMBOLS

1 . . . Substrate
2 . . . Anode
3 . . . Hole injection layer
4 . . . Hole transport layer
5 . . . Organic light emitting layer
6 . . . Electron transport layer
7 . . . Cathode

BEST MODE

Hereinafter, exemplary embodiments of the present invention will be described in more detail.

The organic EL device of the present invention includes a cathode, an anode, and an organic layer disposed between the cathode and the anode, and is characterized in that the organic layer, particularly a light emitting layer includes a compound of the following General Formula (1) described above.

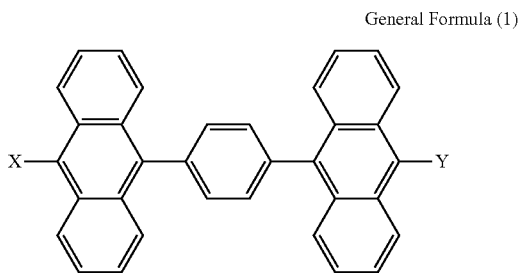

General Formula (1)

The compound of General Formula (1) is particularly useful as a light emitting material.

[Organic Electroluminescence Device]

An organic electroluminescence device of the present invention, that is, an organic EL device includes an organic layer containing the compound of General Formula (1). The organic layer is a light emitting layer, and it is preferred to use the compound of General Formula (1) as a light emitting material in the light emitting layer.

An organic EL device generally includes a first electrode, a second electrode, and one or more organic material layers disposed therebetween, and at least one of the first electrode and the second electrode is a light transmissive electrode. When holes are injected from an anode and electrons are injected from a cathode by applying a voltage between these two electrodes, the holes and the electrons are recombined in the organic material layer, and a light emitting material (emitter) included in the organic material layer emits light using the energy of excitons generated by the recombination. The organic EL device has a structure in which light is emitted from the organic material layer thereof and light is extracted from the side of the light transmissive electrode. The device structure of the organic EL device is not limited to any one, and various device structures have been proposed. As for the light emitting method, a top emission type, a bottom emission type, a double emission (double light emitting) type, and the like are known. The organic material layer of the organic EL device of the present invention may have a single layer structure consisting of one layer or a multi-layer structure having two or more layers, including a light emitting layer. When the organic material layer of the organic EL device of the present invention has a multi-layer structure, the organic material layer may have, for example, a structure in which a hole injection layer, a hole transport layer, a light emitting layer, an electron transport layer, and the like are stacked. Further, it is known that characteristics of an organic EL device may be improved by providing various layers such as a planarization layer for planarizing the surface of an electrode, a hole blocking layer, an electron blocking layer, and/or an exciton blocking layer, and these layers may also be applied to the organic EL device of the present invention. The compound of General Formula (1) of the present invention may be used in organic EL devices of all light emitting methods and structures. Therefore, the method of light emission and the device structure of the organic EL device including the compound of General Formula (1) of the present invention are not limited to specific ones.

A typical structure of the organic EL device is illustrated in FIG. 1. In FIG. 1, 1 denotes a substrate, 2 denotes an anode, 3 denotes a hole injection layer, 4 denotes a hole transport layer, 5 denotes an organic light emitting layer, 6 denotes an electron transport layer, and 7 denotes a cathode. Typically, an organic EL device having the structure illustrated as FIG. 1 is called an organic EL device having a forward structure. The organic EL device of the present invention may have the forward structure, but is not limited to this structure, and may be an organic EL device having a reverse structure, that is, a structure in which a substrate, a cathode, an electron transport layer, an organic light emitting layer, a hole transport layer, a hole injection layer, and a positive electrode are sequentially stacked. Furthermore, several of the plurality of organic layers may be omitted. Further, the organic EL device of the present invention is not limited to the above-described device structure, and may have any publicly-known device structure as the structure of the organic EL device.

The compound of General Formula (1) of the present invention may be used as a light emitting material for an organic EL device, particularly a blue light emitting material.

The organic EL device according to the present invention may be manufactured using methods for manufacturing an organic EL device and materials used for the organic EL device, which are publicly known, except that the use of the compound of General Formula (1) as a light emitting material, particularly a blue light emitting material is employed as a condition. For example, the organic EL device according to the present invention may be manufactured by depositing a metal, an alloy, or a metal oxide having conductivity, or a combination thereof on a substrate to form an anode, forming an organic material layer including one or more layers selected from a hole injection layer, a hole transport layer, a light emitting layer, an electron transport layer, and the like thereon, and then depositing a material, which may be used as a cathode, thereon, by using a physical vapor deposition (PVD) method such as sputtering or e-beam deposition. In addition to the method, as described above, an organic EL device may be made by sequentially depositing a cathode material, an organic material layer, and an anode material on a substrate in order to manufacture the organic EL device having a reverse structure. Further, several of the above-described organic layers may be omitted, and organic layers other than those described above may be added.

As a method of forming the organic material layer, it is possible to use a solution method, for example, a method such as spin coating, dip coating, doctor blade coating, screen printing, inkjet printing, or a thermal transfer method. In addition, a combination of solution and deposition methods may be used for different organic layers.

As a material for an anode, typically, it is preferred to use materials having a high work function so as to facilitate the injection of holes into an organic material layer. Specific examples of the anode material used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as $ZnO:Al$ or $SnO_2:Sb$; a conductive polymer such as poly(3-methylthiophene), poly[3,4-(ethylene-1,2-dioxy)thiophene] (PEDOT), polypyrrole, and polyaniline; and the like, but are not limited thereto.

As a material for a cathode, typically, it is preferred to use materials having a low work function so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2/Al$, but are not limited thereto.

A publicly-known hole injection material may be used in the material for the hole injection layer of the organic EL device of the present invention. A hole injection material is a material that can smoothly receive the injection of holes from the anode at a low voltage, and it is preferred that the highest occupied molecular orbital (HOMO) of the hole injection material is between a work function of the anode material and the HOMO of the organic material layer opposite to the anode adjacent to the hole injection layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone and polyaniline, polythiophene-based conductive polymers and the like, but are not limited thereto.

As the material for the hole transport layer, a publicly-known hole transport material may be used. The material of the hole transport layer is a material that can receive the transport of holes from the anode or the hole injection layer to move the holes to the light emitting layer, and a material having high hole mobility is suitable. Specific examples thereof include: arylamine-based compounds; carbazole-based compounds; anthracene-based compounds; pyrene-based compounds; conductive polymers, and block copolymers having both conjugated portions and non-conjugated portions, and the like, but are not limited thereto.

In the organic EL device of the present invention, as a light emitting material for the light emitting layer, the bisanthracene derivative of General Formula (1) is used. As shown in the following examples, the compound of General Formula (1) of the present invention may be used as a light emitting material for an organic EL device, particularly a blue light emitting material.

When the bisanthracene derivative of General Formula (1) of the present invention is used as a light emitting material for an organic EL device, the bisanthracene derivative may be used alone for the light emitting layer, but it is particularly preferred to use the bisanthrasene derivative as a dopant, that is, a guest material, in combination with a host material. A compound that may be suitably used as a host material is a compound having a larger bandgap than the bisanthrasene derivative of General Formula (1) and also having a charge transport property, and any compound may be selected from the compounds and used as the host material. In the light emitting layer of the organic EL device, a method of using a light emitting material as a guest in combination with a host material is a well-known technique. Many compounds that can be used as host materials for the light emitting layer of the organic EL device are known in the art. Examples of the host material are not limited to those described below, but include, for example, 4,4'-bis(9H-carbazol-9-yl)biphenyl, 4,4'-bis(2,2-diphenylvinyl)biphenyl, 9,9'-bianthracene, 4,4'-bis(9H-carbazol-9-yl)biphenyl, 2,6-bis[3-(9H-carbazol-9-yl)phenyl]pyridine, bis[2-(2-pyridinyl)phenolate]beryllium (II), 4,4'-bis(9H-carbazol-9-yl)-2,2'-dimethylbiphenyl, 2,8-bis(9H-carbazol-9-yl)dibenzothiophene, 2,6-bis(9H-carbazol-9-yl)pyridine, 2,2"-bi-9,9'-spirobi[9H-fluoren], 9,9-bis[4-(1-pyrenyl)phenyl]fluorene, 9,10-bis(4-methoxyphenyl)anthracene, 4,4'-bis(2,2-diphenylvinyl)biphenyl, bis[2-[(oxo)diphenylphosphino]phenyl]ether, 9,10-diphenylanthracene, 9,10-di(1-naphthyl)anthracene, 1,3-di-9-carbazolylbenzene, 9,10-di(2-naphthyl)anthracene, 9-(naphthalen-1-yl)-10-(naphthalen-2-yl)anthracene (α,β-ADN), 3,3'-di(9H-carbazol-9-yl)-1,1'-biphenyl, 9,9'-diphenyl-9H,9'H-3,3'-bicarbazole, 3,3"-di(9H-carbazol-9-yl)-1,1':3',1"-terphenyl, 9-[3-(dibenzofuran-2-yl)phenyl]-9H-carbazole, diphenyl[9,9'-spirobi[9H-fluoren]-2-yl]phosphine oxide, 1,4-di(1-phenyl)benzene, 2,7-di(1-pyrenyl)-9,9'-spirobi[9H-fluorene], 2-methyl-9,10-di(2-naphthyl)anthracene, 2-methyl-9,10-di(1-naphthyl)anthracene, poly(N-vinylcarbazole), 9-phenyl-3,6-bis[4-(1-phenylbenzimidazol-2-yl)phenyl]carbazole, 2-(9,9'-spirobi[fluoren]-2-yl)-4,6-diphenyl-1,3,5-triazine, tris(8-quinolinolato)aluminum, 1,3,5-tri(9H-carbazol-9-yl)benzene, tris(8-quinolinolato)aluminum, 4,4',4"-tri-9-carbazolyltriphenylamine, 1,3,5-tri(1-naphthyl)benzene, 9,9',10,10'-tetraphenyl-2,2'-bianthracene, and 2,2'':7'',2''''-ter-9,9'-spirobi[9H-fluorene].

As a host material to be used in combination with the compound of General Formula (1) of the present invention, it is preferred to use, particularly, an anthracene derivative compound which is an aromatic hydrocarbon having no amino group in the molecule.

Among them, examples of the particularly preferred compound include 9,10-diphenylanthracene, 9,10-di(1-naphthyl)anthracene, 9,10-di(2-naphthyl)anthracene, 9,10-diphenylanthracene, 9-(naphthalen-1-yl)-10-(naphthalen-2-yl)anthracene (α,β-ADN), 2-methyl-9,10-di(2-naphthyl)anthracene, 2-methyl-9,10-di(1-naphthyl)anthracene, and 2-methyl-9-(naphthalen-1-yl)-10-(naphthalen-2-yl)anthracene.

In the organic EL device of the present invention, it is preferred that the compound of General Formula (1) is used in a combination with a host material so as to be included in the light emitting layer in an amount of 0.1 to 10 mass % based on the mass of the light emitting layer.

The organic EL device of the present invention may have an electron transport layer. An electron transport material for forming an electron transport layer is a material that can smoothly receive the injection of electrons from the cathode to move the electrons to the light emitting layer, and it is preferred to use a material having high electron mobility. Specific examples of the electron transport material include Al complexes of 8-hydroxyquinoline; complexes including Alq$_3$; organic radical compounds; hydroxyflavone-metal complexes; anthracene-based compounds; pyrene-based compounds; benzoxazole-based, benzthiazole-based, and benzimidazole-based compounds; pyridyl-based compounds; phenanthroline-based compounds; quinoline-based compounds; quinazoline-based compounds, and the like, but are not limited thereto. In addition, an electron transport layer may be formed by doping these compounds with a metal or metal compound.

In addition to the above-described respective layers, a planarization layer for planarizing the surface of an electrode; and a layer selected from a hole blocking layer, an electron blocking layer, and an exciton blocking layer for confining holes, electrons, and/or excitons in a target organic layer may be used in the organic EL device, if necessary, and such a technology is a publicly-known technology. In addition, the publicly-known technology for the organic EL device may be applied to an organic EL device including the compound of General Formula (1) of the present invention.

Furthermore, since the compound of General Formula (1) of the present invention is dissolved in an organic solvent, an organic layer of an organic EL device, particularly, a light emitting layer may be formed by an application method using a solution including the compound of the present invention.

MODE FOR INVENTION

Hereinafter, the results of the Comparative Examples and the preferred Examples will be provided for helping the understanding of the present invention, and the present invention is not limited to the following Examples.

EXAMPLES

Synthesis Example

The compound PAPAP-0 used in the following Comparative Example is a compound having the following chemical formula.

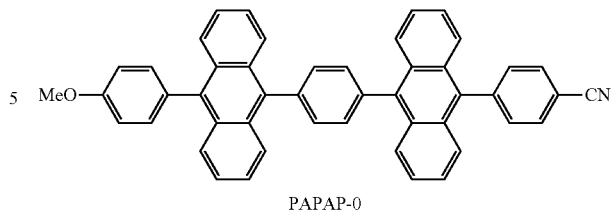

PAPAP-0 may be prepared by a publicly known method set forth, for example, in Adv. Funct. Mater. 24, p. 2064-2071, 2014. In this case, PAPAP-0 was synthesized by the following synthesis method.

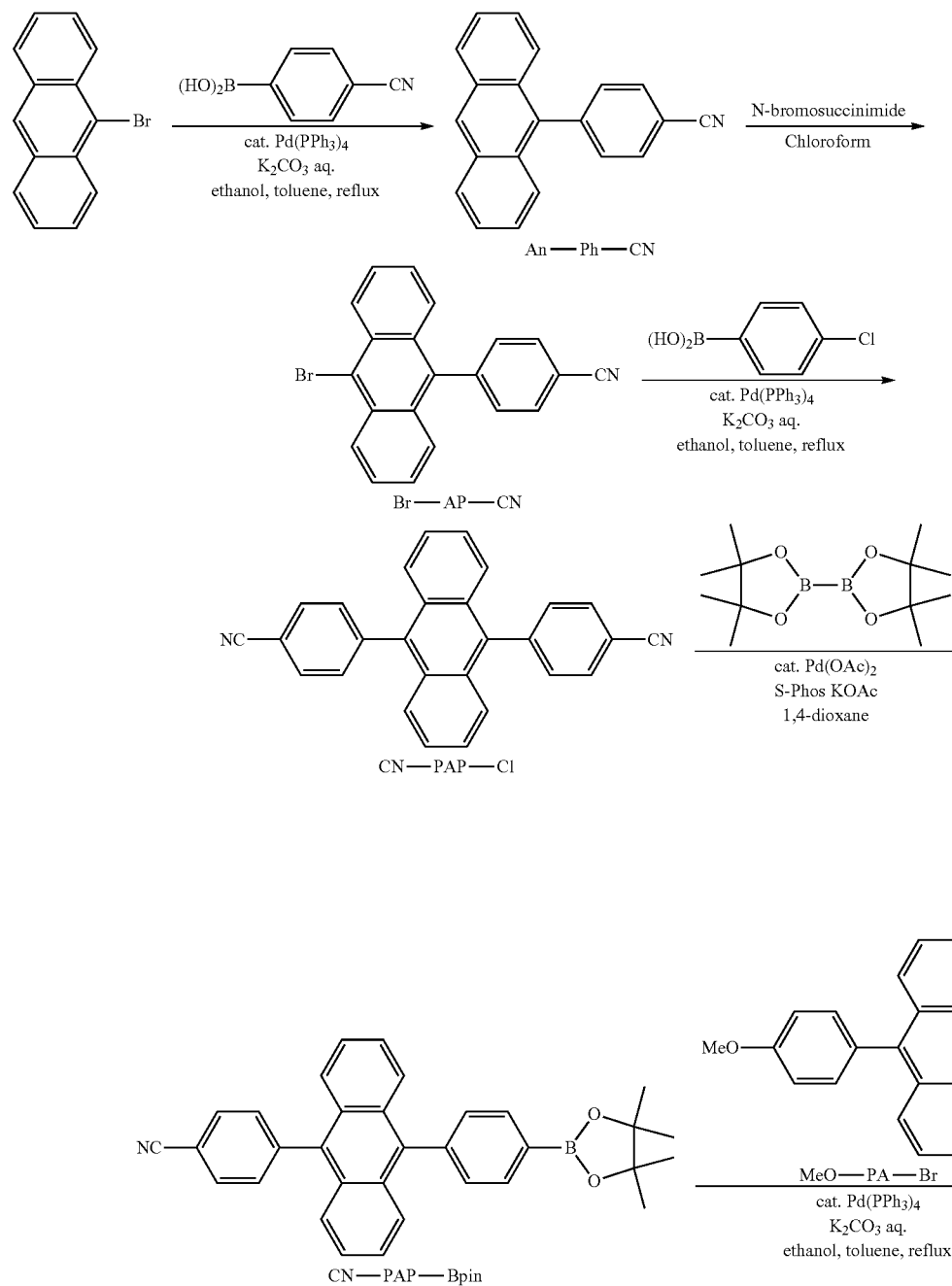

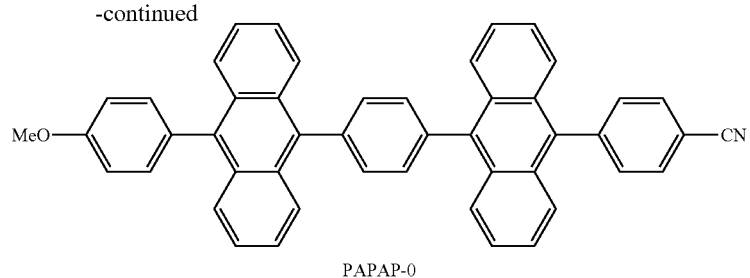

PAPAP-0

That is, 9-bromoanthracene and 4-benzonitrile boronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid An-Ph-CN at a yield of 95%. Next, a mixed solution consisting of An-Ph-CN, N-bromosuccinimide, and chloroform was refluxed under heating under nitrogen in a four-necked flask, and then the resulting product was purified to obtain a yellowish white solid Br-AP-CN at a yield of 95%. Next, Br-AP-CN and 4-chlorophenylboronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then ON-PAP-Cl was obtained. Next, a mixed solution consisting of CN-PAP-Cl, bis(pinacolato)diboron, S-Phos, 1,4-dioxane, potassium acetate, and palladium acetate was refluxed under heating under nitrogen in a four-necked flask, and then the resulting product was purified to obtain a yellow solid CN-PAP-Bpin at a yield of 96%. Next, CN-PAP-Bpin and MeO-PA-Br were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain an orange color solid PAPAP-0 at a yield of 86%.

PAPAP-1 is represented by the following structural formula, and may be prepared by a method shown below in accordance with the synthesis method of PAPAP-0.

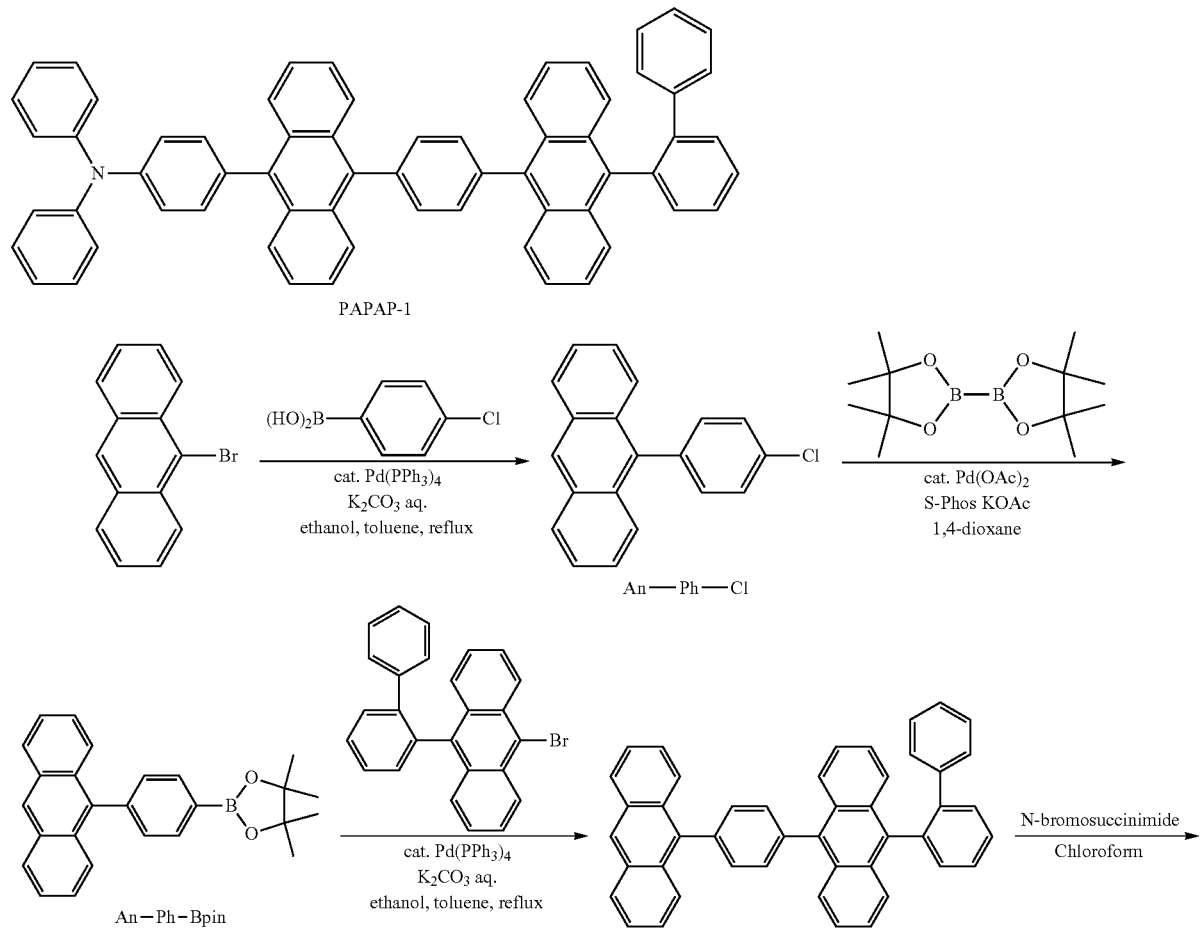

-continued

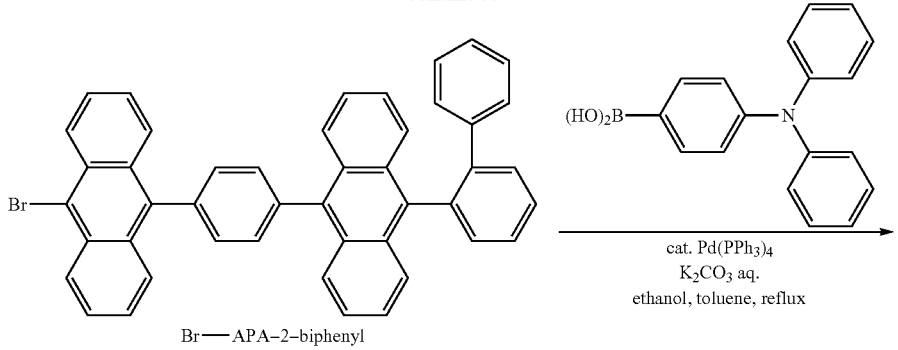

Br—APA-2-biphenyl

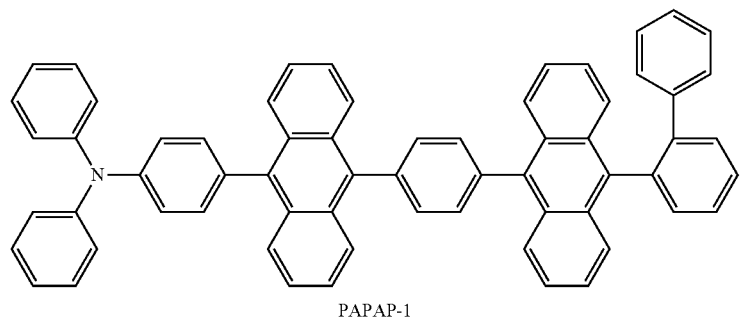

PAPAP-1

That is, 9-bromoanthracene and 4-chlorophenyl boronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid An-Ph-Cl at a yield of 87.7%. Next, a mixed solution consisting of An-Ph-Cl, bis(pinacolato) diboron, S-Phos, 1,4-dioxane, potassium acetate, and palladium acetate was refluxed under heating under nitrogen in a four-necked flask, and then the resulting product was purified to obtain a yellow solid An-Ph-Bpin at a yield of 57%. Next, 9-bromo-10-([1,1'-biphenyl]-2-yl)anthracene and An-Ph-Bpin were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid APA-2-biphenyl at a yield of 72.5%. Next, a mixed solution consisting of APA-2-biphenyl, N-bromosuccinimide, and chloroform was refluxed under heating under nitrogen in a four-necked flask, and then the resulting product was purified to obtain a yellowish white solid Br-APA-2-biphenyl at a yield of 92%. Next, Br-APA-2-biphenyl and 4-(diphenylamino)phenyl boronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid PAPAP-1 at a yield of 91%.

PAPAP-12 is represented by the following structural formula, and may be prepared by a method shown below in accordance with the synthesis method of PAPAP-0.

PAPAP-12

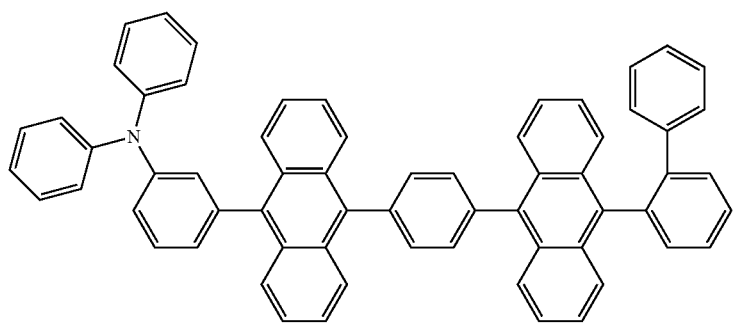

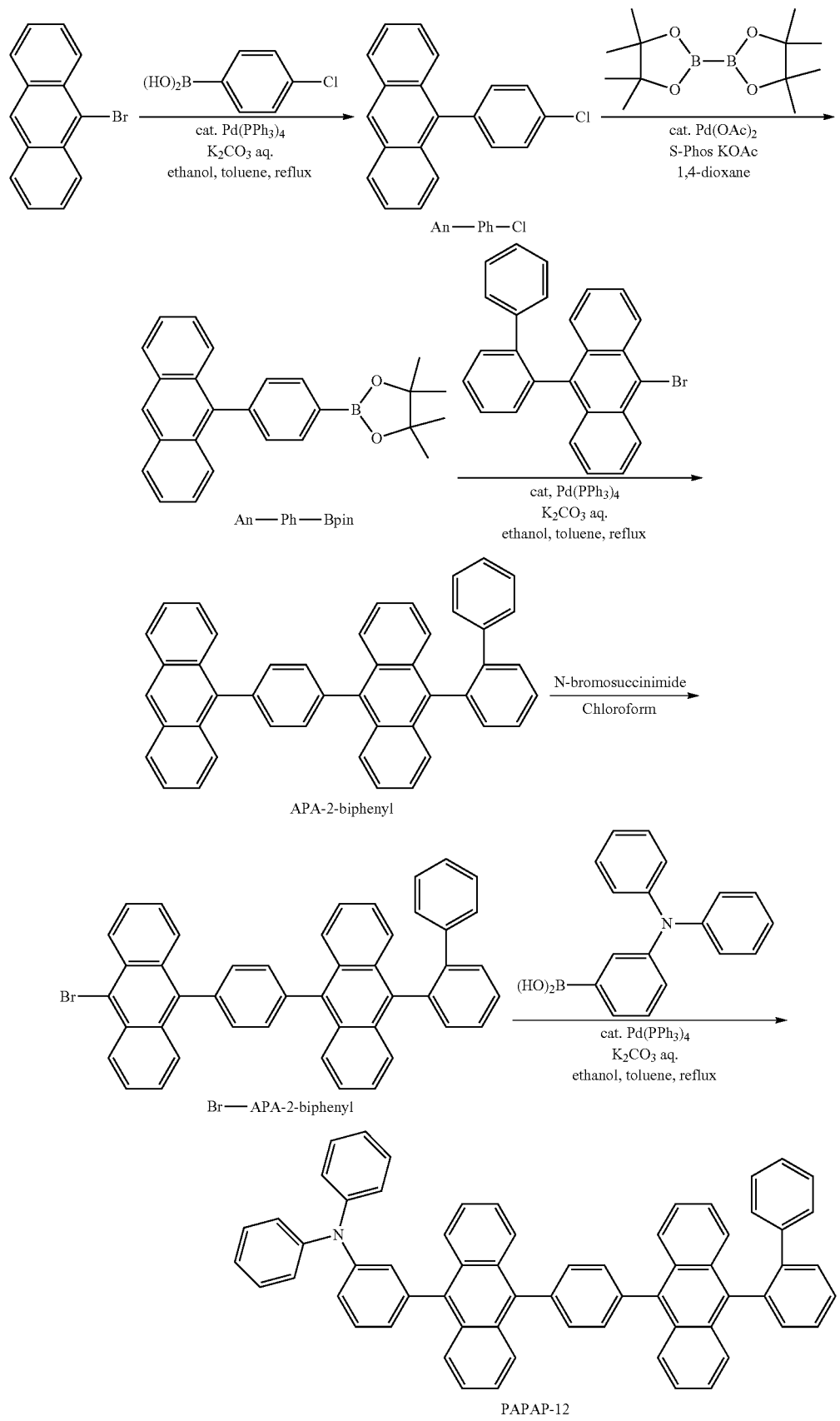

That is, 9-bromoanthracene and 4-chlorophenyl boronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid An-Ph-Cl at a yield of 87.7%. Next, a mixed solution consisting of An-Ph-Cl, bis(pinacolato) diboron, S-Phos, 1,4-dioxane, potassium acetate, and palladium acetate was refluxed under heating under nitrogen in a four-necked flask, and then the resulting product was purified to obtain a yellow solid An-Ph-Bpin at a yield of 57%. Next, 9-bromo-10-([1,1'-biphenyl]-2-yl)anthracene and An-Ph-Bpin were put into a four-necked flask, the resulting mixture was refluxed under heating under nitrogen in a mixed solution consisting of ethanol, toluene, an aqueous potassium carbonate solution, and tetrakistriphenylphosphine palladium, and then the resulting product was purified to obtain a yellowish white solid APA-2-biphenyl at a yield of 72.5%. Next, a mixed solution consisting of APA-2-biphenyl, N-bromosuccinimide, and chloroform was refluxed under heating under nitrogen in a four-necked flask, and then the resulting product was purified to obtain a yellowish white solid Br-APA-2-biphenyl at a yield of 92%. Next, Br-APA-2-biphenyl and 3-(diphenylamino)phenyl boronic acid were put into a four-necked flask, the resulting mixture was refluxed under heating under nitrogen in a mixed solution consisting of an aqueous potassium carbonate solution, ethanol, toluene, and tetrakistriphenylphosphine palladium, and then the resulting product was purified to obtain a yellowish white solid PAPAP-12 at a yield of 26%.

[Example 1] Solubility Test of PAPAP Derivative

Solubility tests were performed on PAPAP-1 and PAPAP-0 obtained from the Synthetic Example using cyclohexanone as a solvent. 10 mg of each of PAPAP-1 and PAPAP-0 was measured, 1 mL of cyclohexanone was added thereto, and thermal stirring was performed at a temperature of about 100° C.

By performing a solubility test with thermal stirring, it was confirmed that PAPAP-1 was soluble and PAPAP-0 was insoluble in cyclohexanone.

[Evaluation of Optical Characteristics]

The apparatus and measurement conditions used to evaluate the optical characteristics of the test sample are as follows.
(1) Ultraviolet Visible (UV-Vis) Spectrophotometer
   Shimadzu Corporation UV-2600
   Measurement conditions; Scan speed medium speed, measurement range 200 to 800 nm
   Sampling pitch 0.5 nm, slit width 0.5 nm
(2) Fluorescence Spectrophotometer
   HORIBA, Ltd. FluoroMax 2
   Light source: Xenon lamp Integration Time: 5.0 sec
   Exicit Mono Slits: 0.300 mm, Emiss Mono Slits: 0.300
(3) Measurement of Light Emitting Quantum Yield
   Hamamatsu Photonics K.K. Integrating sphere, excitation light irradiation device L10092+A10079
   Excitation light: 300 to 400 nm Example 2

The absorption (UV-vis)emission (PL) spectra were measured by preparing a toluene solution ($10^{-5}$ M) of PAPAP-1. The results are shown in FIG. 2. From the results of the UV-vis absorption spectrum, it was observed that the absorption edge of PAPAP-1 had a longer wavelength than PAPAP-0 (left side of FIG. 2). Further, it was also observed from the PL spectrum (right side of FIG. 2) that the light emitting wavelength was lengthened.

Example 3

The light emitting quantum yield was measured by preparing a toluene solution ($10^{-5}$ M) of PAPAP-1. The measurement results are shown in the following Table 1.

Comparative Example 1

By performing the same processes as those described in Examples 2 and 3 using PAPAP-0 instead of PAPAP-1 as Comparative Example 1, the absorption (UV-vis)emission (PL) spectra and the light emitting quantum yield were measured.

[Evaluation Results]

The evaluation results of Examples 2 and 3 and Comparative Example 1 are shown in Table 1.

TABLE 1

| Compound | Light emitting wavelength (nm) | Full width at half maximum (nm) | Light emitting quantum yield (%) |
|---|---|---|---|
| PAPAP-1 | 454 | 68 | 61 |
| PAPAP-0 | 424 | 54 | 69 |

Example 4

First, a glass substrate on which a pre-patterned indium tin oxide (ITO) was thin-film-deposited to a thickness of 100 nm was placed in distilled water in which a detergent was dissolved, and washed with ultrasonic waves. In this case, a product manufactured by Fisher Co., was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing with distilled water was completed, the surface was ultrasonically washed sequentially with acetone, distilled water, and an isopropyl alcohol solvent, dried, and then surface-treated with UV-ozone ($O_3$). Thereafter, in order to form an organic layer, a hole injection layer, a hole transport layer (HTL), and a light emitting layer were sequentially film-formed by spin coating. After film formation by spin coating, a substrate on which each of the above-described layers was deposited was put into a vapor deposition apparatus, and each one layer of a hole blocking layer, an electron transport layer, an electron injection layer and a negative electrode was sequentially deposited on the light emitting layer at a vacuum degree of about $10^{-4}$ to about $10^{-5}$ Pa.

More specifically, a toluene solution of a mixture of the following Compound A and the following Compound B mixed at a weight ratio of 8:2 (concentration of the mixture 1 mass %) was applied onto the ITO transparent electrode by a spin coating method and cured in a nitrogen atmosphere on a hot plate under conditions of 220° C. and 30 minutes to form a hole injection layer having a film thickness of 40 nm.

[Compound A]

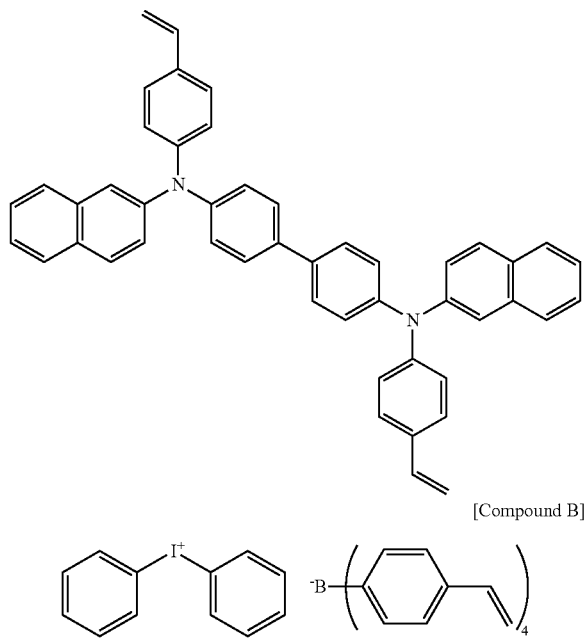

A composition prepared by dissolving the following compound C at a weight ratio of 1% with respect to toluene was applied onto the hole injection layer by a spin coating method, and heat-treated on a hot plate under conditions of 200° C. and 30 minutes to form a hole transport layer having a film thickness of 20 nm.

[Compound B]

[Compound C]

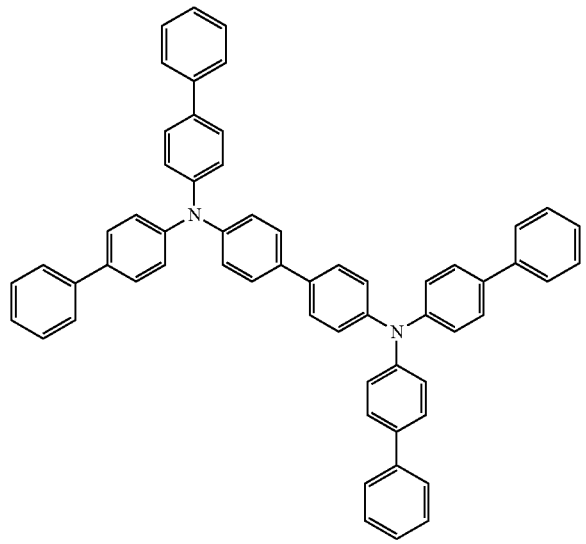

For the light emitting layer, 9-(naphthalen-1-yl)-10-(naphthalen-2-yl)anthracene (α,β-ADN) was used as a light emitting host material, and PAPAP-1 was used as a dopant material. A light emitting layer was formed by applying a solution including these components to a base material and removing the solvent. The concentration of the solution was adjusted to 2 mg/ml using cyclohexanone as the solvent to form a layer having a film thickness of about 20 nm by a spin coating method. The doping amount of the dopant material was 10 mass % based on the total amount of the host material.

Next, in order to sequentially form a hole blocking layer, an electron transport layer, and a metal layer on the light emitting layer, the substrate was transferred to a deposition apparatus, and the hole blocking layer was formed as a layer having a thickness of about 5 nm using 2-(3-(dibenzothiophen-4-yl)-[1,1-biphenyl]-3-yl)-4,6-diphenyl-1,3,5-triazine (DBT-TRZ). The electron transport layer was formed as a layer having a thickness of about 30 nm using 1,4-di(1,10-phenanthrolin-2-yl)benzene (DPB) as a host material and 8-hydroxyquinolinolato-lithium (Liq) as a guest material. The doping amount of the dopant material was 20 mass % based on the total amount of the host material. The electron injection layer was formed as a layer having a thickness of about 1 nm using 8-hydroxyquinolinolato-lithium (Liq), and a second electrode was formed as a layer having a thickness of about 75 nm using aluminum (Al). An organic EL device was manufactured according to the above-described method.

[Manufacture and Evaluation Results of Organic EL Device]

The light emitting characteristics of the organic EL device manufactured in accordance with the above-described method were measured using PHOTONIC MULTI-CHANNEL ANALYZER PMA-11 of Hamamatsu Photonics K.K. The measurement results are shown in the following table.

A non-doped type organic EL device of PAPAP-1 was manufactured using only PAPAP-1 without using a light emitting host material when the light emitting layer was formed. The measurement results of the light emitting characteristics are shown in the following Table 2.

TABLE 2

| Light emitting layer | $V_{on}$[a] (V) | $V_{100}/\eta_{p.100}/$ $\eta_{c.100}/$ $\eta_{ext.100}$[b] (V/1 m W$^{-1}$/ cd A$^{-1}$/%) | $V_{1000}/\eta_{p.1000}/$ $\eta_{c.1000}/$ $\eta_{ext.1000}$[c] (V/1 m W$^{-1}$/ cd A$^{-1}$/%) | CIE100[d] (x, y) |
|---|---|---|---|---|
| single film | 2.77 | 3.44/2.98/ 3.27/2.30 | 4.84/2.15/ 3.32/2.17 | (0.14, 0.20) |

[a] Light emission initiation voltage (V) (@ 1 cd m$^{-2}$)
[b] Voltage (V), Power efficiency ($\eta_p$), Current efficiency ($\eta_c$), External quantum efficiency ($\eta_{ext.}$) (@ 100 cd m$^{-2}$)
[c] Voltage (V), Power efficiency ($\eta_p$), Current efficiency ($\eta_c$), External quantum yield ($\eta_{ext.}$) (@ 1000 cd m$^{-2}$)
[d] Plane coordinates x and y of the Commission International de l' Eclairage (CIE) (@ 100 cd m$^{-2}$) chromaticity diagram.

The measurement results of the light emitting characteristics of the doped type organic EL device of PAPAP-1 manufactured as Example 4 are shown in the following Table 3.

TABLE 3

| Light emitting layer | $V_{on}$[a] (V) | $V_{100}/\eta_{p.100}/$ $\eta_{c.100}/\eta_{ext.100}$[b] (V/1 m W$^{-1}$/ cd A$^{-1}$/%) | $V_{1000}/\eta_{p.1000}/$ $\eta_{c.1000}/\eta_{ext.1000}$[c] (V/1 m W$^{-1}$/ cd A$^{-1}$/%) | CIE100[d] (x, y) |
|---|---|---|---|---|
| Doped film | 2.79 | 3.54/4.16/ 4.68/3.65 | 4.91/3.20/ 4.99/3.90 | (0.14, 0.18) |

[a] Light emission initiation voltage (V) (@ 1 cd m$^{-2}$)
[b] Voltage (V), Power efficiency ($\eta_p$), Current efficiency ($\eta_c$), External quantum efficiency ($\eta_{ext.}$) (@ 100 cd m$^{-2}$)
[c] Voltage (V), Power efficiency ($\eta_p$), Current efficiency ($\eta_c$), External quantum yield ($\eta_{ext.}$) (@ 1000 cd m$^{-2}$)
[d] Plane coordinates x and y of the Commission International de l' Eclairage (CIE) (@ 100 cd m$^{-2}$) chromaticity diagram.

From the results shown in Table 2, it can be seen that by using Compound PAPAP-1 which is an aspect of the present invention as a material for a light emitting layer (EML), a doped type organic EL device, which is difficult to manufacture when a technique in the related art PAPAP-0 is used, is successfully manufactured. Further, from the results shown in Table 3, it can be seen that the light emitting efficiency of the organic EL device is improved by changing the light emitting layer from a layer made of only a light emitting material to a doped film in which the light emitting layer is doped with a host material.

The compounds PAPAP-1 and PAPAP-12 used in the following test are compounds having the following chemical formulae.

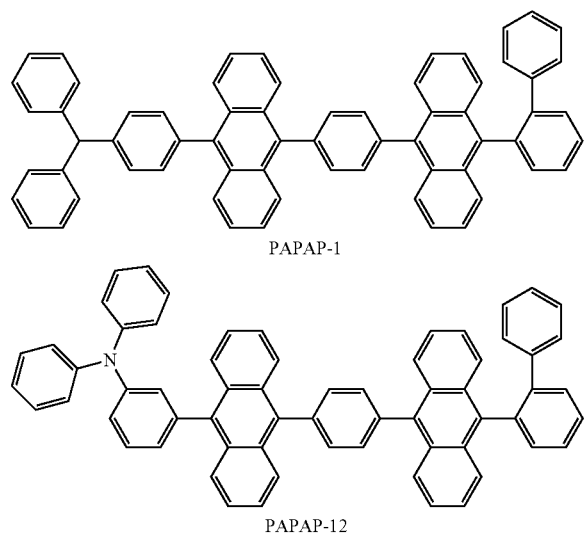

PAPAP-1

PAPAP-12

[Example 5] Comparative Test of Solubility of PAPAP Derivative

The solubilities of PAPAP-12 and PAPAP-1 were tested using cyclohexanone as a solvent. 10 mg of each of PAPAP-12 and PAPAP-1 was measured, 1 mL of cyclohexanone was added thereto, and thermal stirring was performed at a temperature of about 100° C.

By performing a solubility test under thermal stirring conditions, it was confirmed that both PAPAP-1 and PAPAP-12 were soluble in cyclohexanone.

[Evaluation of Optical Characteristics]

The apparatus and measurement conditions used to evaluate the following optical characteristics are as follows.
(1) Ultraviolet Visible (UV-Vis) Spectrophotometer
   Shimadzu Corporation UV-2600
   Measurement conditions; Scan speed medium speed, measurement range 200 to 800 nm
   Sampling pitch 0.5 nm, slit width 0.5 nm
(2) Fluorescence Spectrophotometer
   HORIBA, Ltd. FluoroMax 2
   Light source: Xenon lamp Integration Time: 5.0 sec
   Exicit Mono Slits: 0.300 mm, Emiss Mono Slits: 0.300
(3) Measurement of Light Emitting Quantum Yield
   Hamamatsu Photonics K.K. Integrating sphere, excitation light irradiation device L10092+A10079
   Excitation light: 300 to 400 nm Example 6

The absorption (UV-vis)emission (PL) spectra were measured by preparing a toluene solution ($10^{-5}$ M) of PAPAP-12. The results are shown in FIG. 3. From the results of the UV-vis absorption spectrum, it was observed that the absorption edge of PAPAP-12 had a shorter wavelength than PAPAP-1. Further, it was also observed from the PL spectrum that the light emitting wavelength was shortened.

Example 7

The light emitting quantum yield was measured by preparing a toluene solution ($10^{-5}$ M) of PAPAP-12. The measurement results are shown in the following Table 4.

By performing substantially the same processes as those described in Examples 2 and 3 using PAPAP-1 instead of PAPAP-12, the absorption (UV-vis)emission (PL) spectra and the light emitting quantum yield were measured.

[Evaluation Results]

The evaluation results of Examples 6 and 7 are shown in Table 4.

TABLE 4

| Compound | Light emitting wavelength (nm) | Full width at half maximum (nm) | Light emitting quantum yield (%) |
|---|---|---|---|
| PAPAP-12 | 421 | 65 | 69 |
| PAPAP-1 | 454 | 68 | 61 |

It can be seen that PAPAP-12 has a shorter light emitting wavelength, a narrower full width at half maximum, and a higher light emitting quantum yield than PAPAP-1.

Example 8

First, a pattern was formed in advance, and a washed ITO-glass substrate was surface-treated using UV-ozone (O3). The thickness of the ITO layer (first electrode) of the ITO-glass substrate was about 100 nm. After the surface treatment, in order to form an organic layer, a hole injection layer, a hole transport layer (HTL), and a light emitting layer were sequentially film-formed by spin coating. After film formation by spin coating, a substrate on which each of the above-described layers was deposited was put into a vapor deposition apparatus, and each one layer of a hole blocking layer, an electron transport layer, an electron injection layer and a negative electrode was sequentially deposited on the light emitting layer at a vacuum degree of about $10^{-4}$ to about $10^{-5}$ Pa.

More specifically, a toluene solution of a mixture of the following Compound A and the following Compound B mixed at a weight ratio of 8:2 (concentration of the mixture 1 mass %) was applied onto the ITO transparent electrode by a spin coating method and cured in a nitrogen atmosphere on a hot plate under conditions of 220° C. and 30 minutes to form a hole injection layer having a film thickness of 40 nm.

[Compound A]

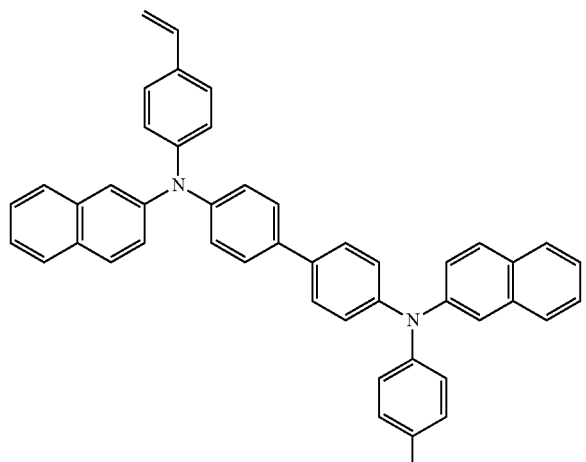

[Compound B]

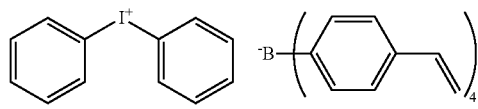

A composition prepared by dissolving the following compound C at a weight ratio of 1% with respect to toluene was applied onto the hole injection layer by a spin coating method, and heat-treated on a hot plate under conditions of 200° C. and 30 minutes to form a hole transport layer having a film thickness of 20 nm.

[Compound C]

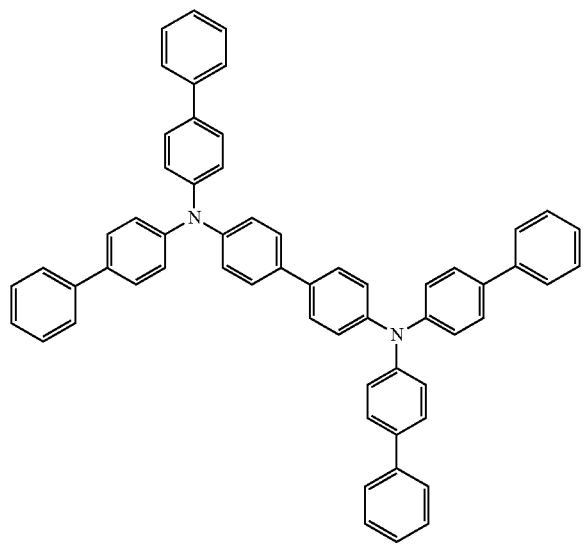

For the light emitting layer, 9-(naphthalen-1-yl)-10-(naphthalen-2-yl)anthracene (α,β-ADN) was used as a light emitting host material, and PAPAP-12 was used as a dopant material. A light emitting layer was formed by applying a solution including these components to a base material and removing the solvent. The concentration of the solvent was adjusted to 2 mg/ml using cyclohexanone in the solvent to form a layer having a film thickness of about 20 nm by a spin coating method. The doping amount of the dopant material was 10 mass % based on the total amount of the host material.

Next, in order to sequentially form a hole blocking layer, an electron transport layer, and a metal layer on the light emitting layer, the substrate was transferred to a deposition apparatus, and the hole blocking layer was formed as a layer having a thickness of about 5 nm using 2-(3-(dibenzothiophen-4-yl)-[1,1-biphenyl]-3-yl)-4,6-diphenyl-1,3,5-triazine (DBT-TRZ). The electron transport layer was formed as a layer having a thickness of about 30 nm using 1,4-di(1,10-phenanthrolin-2-yl)benzene (DPB) as a host material and 8-hydroxyquinolinolato-lithium (Liq) as a guest material. The doping amount of the dopant material was 20 mass % based on the total amount of the host material. The electron injection layer was formed as a layer having a thickness of about 1 nm using 8-hydroxyquinolinolato-lithium (Liq), and a second electrode was formed as a layer having a thickness of about 75 nm using aluminum (Al). An organic EL device was manufactured by above-described method.

[Manufacture and Evaluation Results of Organic EL Device]

The light emitting characteristics of the organic EL device manufactured in accordance with the above-described method were measured using PHOTONIC MULTI-CHANNEL ANALYZER PMA-11 of Hamamatsu Photonics K.K. The measurement results are shown in the following table.

A non-doped type organic EL device of PAPAP-12 was manufactured using only PAPAP-12 without using a light emitting host material when the light emitting layer was formed. The measurement results of the light emitting characteristics are shown in the following Table 5.

TABLE 5

| Light emitting layer | $V_{on}$[a] (V) | $V_{100}/\eta_{p.100}/$ $\eta_{c.100}/\eta_{ext.100}$[b] (V/1 m W$^{-1}$/ cd A$^{-1}$/%) | $V_{1000}/\eta_{p.1000}/$ $\eta_{c.1000}/\eta_{ext.1000}$[c] (V/1 m W$^{-1}$/ cd A$^{-1}$/%) | CIE100[d] (x, y) |
|---|---|---|---|---|
| Single film | 3.18 | 4.38/0.77/ 1.08/0.96 | 6.85/0.45/ 0.99/0.87 | (0.17, 0.15) |

[a] Light emission initiation voltage (V), Power efficiency ($\eta_p$), Current efficiency ($\eta_c$), External quantum efficiency ($\eta_{ext.}$) (@ 1 cd m$^{-2}$)
[b] Voltage (V), Power efficiency ($\eta_p$), Current efficiency ($\eta_c$), External quantum efficiency ($\eta_{ext.}$) (@ 100 cd m$^{-2}$)
[c] Voltage (V), Power efficiency ($\eta_p$), Current efficiency ($\eta_c$), External quantum yield ($\eta_{ext.}$) (@ 1000 cd m$^{-2}$)
[d] Plane coordinates x and y of the Commission International de l' Eclairage (CIE) (@ 100 cd m−2) chromaticity diagram.

A doped type organic EL device of PAPAP-12 was manufactured using the light emitting host material as described above when the light emitting layer was formed. The measurement results of the light emitting characteristics are shown in the following Table 6.

TABLE 6

| Light emitting layer | $V_{on}$[a] (V) | $V_{100}/\eta_{p.100}/$ $\eta_{c.100}/\eta_{ext.100}$[b] (V/1 m W$^{-1}$/ cd A$^{-1}$/%) | $V_{1000}/\eta_{p.1000}/$ $\eta_{c.1000}/\eta_{ext.1000}$[c] (V/1 m W$^{-1}$/ cd A$^{-1}$/%) | CIE100[d] (x, y) |
|---|---|---|---|---|
| Doped film | 2.81 | 3.46/1.56/ 1.72/1.83 | 5.10/0.98/ 1.59/1.72 | (0.15, 0.10) |

[a] Light emission initiation voltage (V), Power efficiency ($\eta_p$), Current efficiency ($\eta_c$), External quantum efficiency ($\eta_{ext.}$) (@ 1 cd m$^{-2}$)
[b] Voltage (V), Power efficiency ($\eta_p$), Current efficiency ($\eta_c$), External quantum efficiency ($\eta_{ext.}$) (@ 100 cd m$^{-2}$)
[c] Voltage (V), Power efficiency ($\eta_p$), Current efficiency ($\eta_c$), External quantum yield ($\eta_{ext.}$) (@ 1000 cd m$^{-2}$)
[d] Plane coordinates x and y of the Commission International de l' Eclairage (CIE) (@ 100 cd m−2) chromaticity diagram.

From the results shown in Table 5, for an organic EL device having a light emitting layer (EML) formed using PAPAP-12 which is an aspect of the present invention as a light emitting material, the light emitting wavelength became shorter than the case where PAPAP-1 was used as a light emitting material. Furthermore, from the results shown in Tables 5 and 6, it can be seen that the light emitting efficiency is improved by changing the light emitting layer from the non-doped film to the doped film.

INDUSTRIAL APPLICABILITY

The compound of the present invention can be used as a material for an organic electroluminescence device, particularly, as a blue light emitting material.

The invention claimed is:

1. A compound of the following General Formula (1):

General Formula (1)

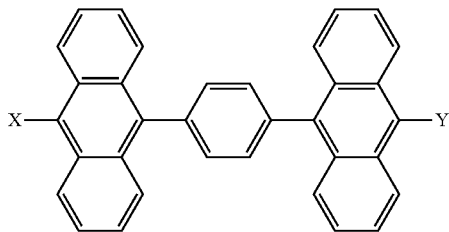

in General Formula (1), X and Y represent substituents, X and Y are not the same as each other, X is a substituent of General Formula (2), and Y is a phenyl group having an alkyl or aryl substituent at one ortho position:

General Formula (2)

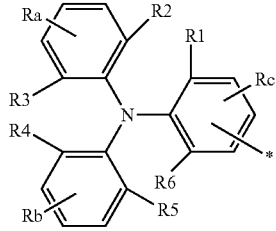

in General Formula (2),

R2 to R5 are each independently hydrogen or a substituent optionally independently mono-, di-, tri-, tetra-, or penta-substituted;

R1 and R6 are each independently hydrogen, or a substituent optionally independently mono-, di-, tri-, tetra-, or penta-substituted;

or R1 and R2, and R5 and R6 are each independently bonded with each other, respectively, through a single bond, an alkylene, an arylene, —O—, —S—, SiR11R12, —NR—, or —BR—;

or R3 and R4 are boned with each other through an alkylene, an arylene, —O—, —S—, SiR11R12, —NR—, or —BR—

R11 and R12 are each independently an alkyl group or an aryl group;

R is a hydrogen atom, an alkyl group, or an aryl group;

Ra and Rb are each independently a substituent optionally independently mono-, di-, tri-, tetra-, or penta-substituted, or not present, Rc is a substituent optionally mono-, di-, tri-, or tetra-substituted, or not present;

the substituent is independently an alkyl group or an aryl group; and

* represents a position which is bonded to the anthracene ring on the left side of General Formula (1) at any one of the ortho, meta, or para positions with respect to nitrogen atom of the triphenylamine of General Formula (2).

2. The compound of claim 1, wherein Y is an o-biphenyl group.

3. A light emitting material for an organic electroluminescence device, comprising the compound of claim 1.

4. An organic electroluminescence device comprising the compound of claim 1.

5. An organic electroluminescence device having a light emitting layer comprising the compound of claim 1.

6. The organic electroluminescence device of claim 5, wherein the device comprises the compound as an emitter in the light emitting layer.

7. The organic electroluminescence device of claim 6, wherein the device further comprises an anthracene derivative compound, which is an aromatic hydrocarbon having no amino group, as a host material in the light emitting layer.

8. The compound of claim 1, wherein the compound is represented by any one of chemical formulae shown below:

PAPAP-1

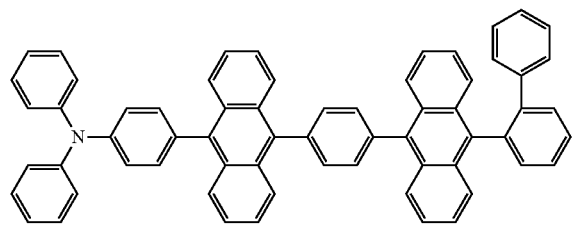

PAPAP-3

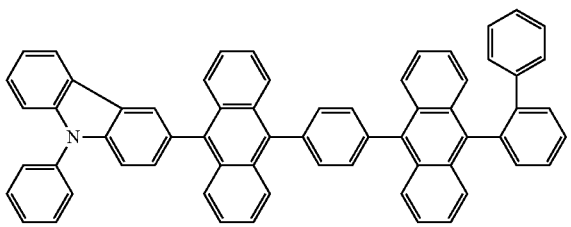

-continued
PAPAP-4
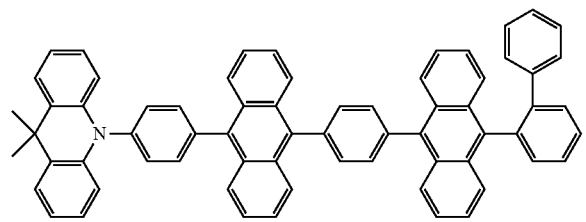
PAPAP-5
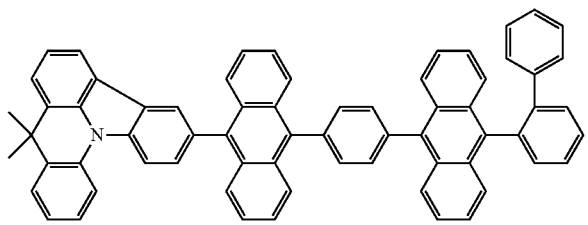
PAPAP-6
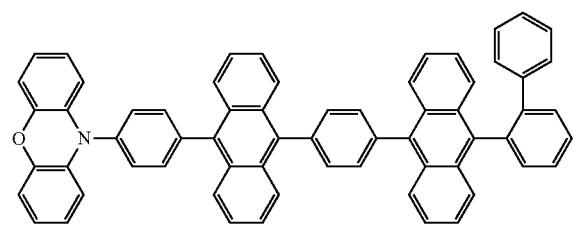
PAPAP-7
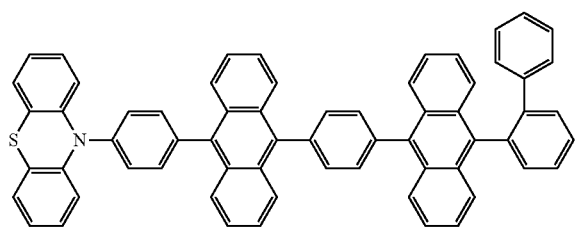
PAPAP-8
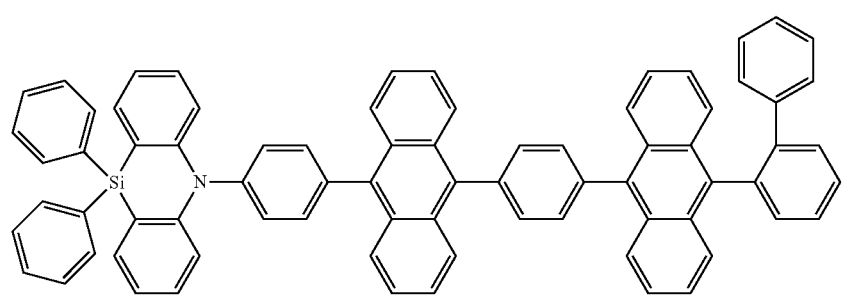
PAPAP-9
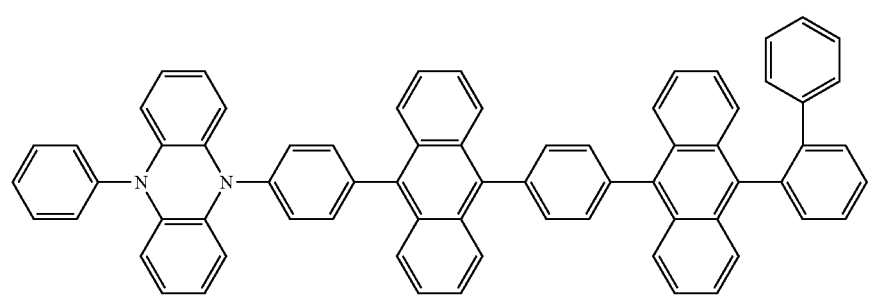
PAPAP-10
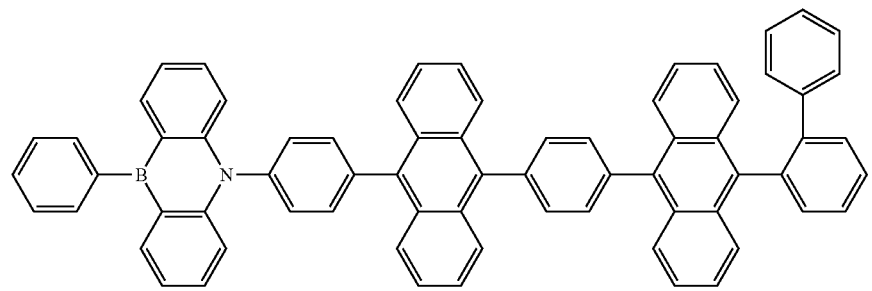

-continued
PAPAP-11
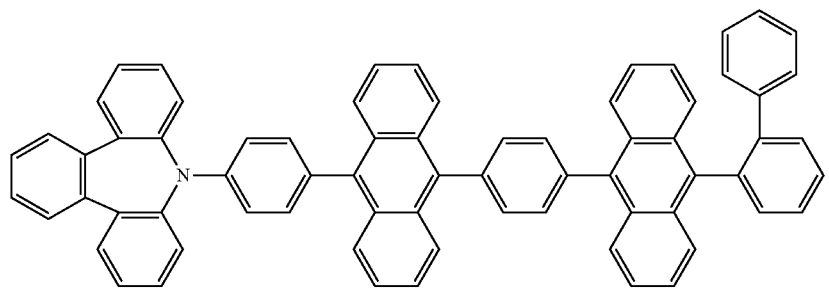
PAPAP-12
PAPAP-14
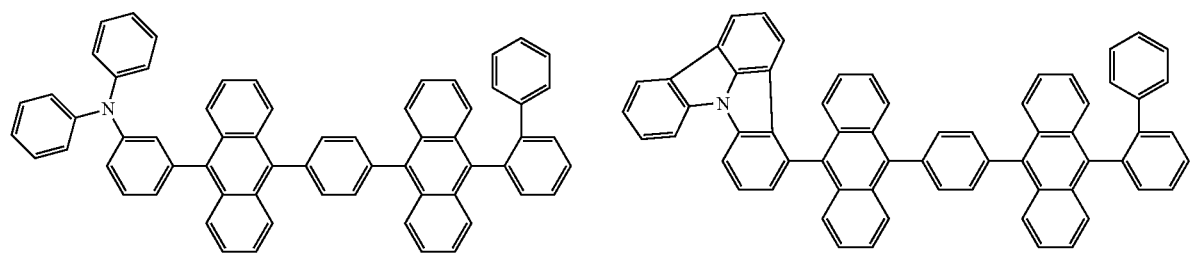
PAPAP-15
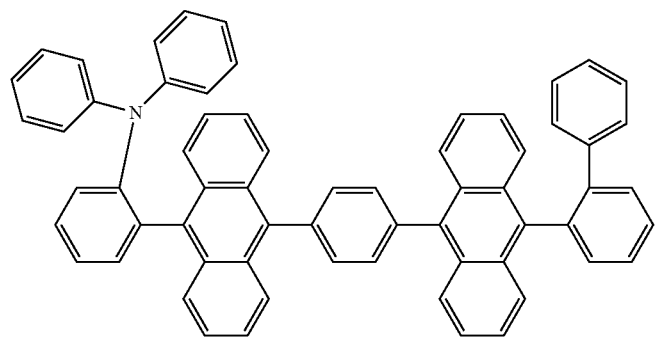
PAPAP-17
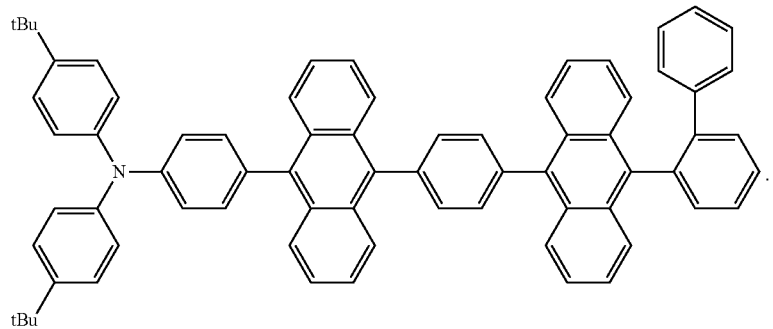
* * * * *